United States Patent [19]
Paniccia et al.

[11] Patent Number: 5,872,360
[45] Date of Patent: Feb. 16, 1999

[54] METHOD AND APPARATUS USING AN INFRARED LASER BASED OPTICAL PROBE FOR MEASURING ELECTRIC FIELDS DIRECTLY FROM ACTIVE REGIONS IN AN INTEGRATED CIRCUIT

[75] Inventors: Mario J. Paniccia, Santa Clara; Valluri R. Rao, Saratoga, both of Calif.

[73] Assignee: Intel Corporation, Santa Clara, Calif.

[21] Appl. No.: 766,149

[22] Filed: Dec. 12, 1996

[51] Int. Cl.[6] .................................................. G01R 31/28
[52] U.S. Cl. .................................. 250/341.4; 250/341.8; 324/753
[58] Field of Search .............................. 250/341.4, 341.8, 250/340, 341.2; 324/753, 752, 750

[56] References Cited

U.S. PATENT DOCUMENTS

| | | | |
|---|---|---|---|
| 3,976,873 | 8/1976 | Bottka et al. | 455/619 |
| 4,144,503 | 3/1979 | Itoh et al. | 331/94 |
| 4,273,421 | 6/1981 | Gurtler | 350/353 |
| 4,480,916 | 11/1984 | Bareket et al. | 356/351 |
| 4,503,541 | 3/1985 | Weller et al. | 372/50 |
| 4,583,226 | 4/1986 | Liou | 372/19 |
| 4,661,770 | 4/1987 | von Roos | 324/158 |
| 4,758,092 | 7/1988 | Heinrich et al. | 356/364 |
| 5,097,201 | 3/1992 | Henley | 324/96 |
| 5,164,664 | 11/1992 | Soelkner . | |

OTHER PUBLICATIONS

K.J. Weingarten et al., Picosecond Optical Sampling of GaAs Integrated Circuits, IEEE J Quantum Electronics 24 (2) (1988).

H. K. Heinrich et al., Noninvasive Sheet Charge Density Probe for Integrated Silicon Devices, Appl. Phys. Lett. 48 (16) (1986).

Marvin Chester & Paul H. Wendland, Electroabsorption Spectrum in Silicon, Physical Review Letters 13 (6) (1964).

Bernard Couillaud & Vittorio Fossati–Bellani, Modelocked Lasers and Ultrashort Pulses, Lasers & Applications (1985).

Dr. Hansjoachim Hinkelmann, Scanning Laser Microscopy, reprinted from Semiconductor International, Cahners Publishing Co, (1985).

T. Nagatsuma et al., Electro–Optic Probing Technology for Ultrahigh–Speed IC Diagnosis, IEEE/IMTC (1994).

J. M. Wiesenfeld, Electro–optic Sampling of High–Speed Devices and Integrated Circuits, IBM J. Res. Develop., vol. 34 (2/3) (1990).

H. K. Heinrich, A Noninvasive Optical Probe for Detecting Electrical Signals in Silicon Integrated Circuits (1987). (unpublished Ph.D. dissertation, Stanford University).

(List continued on next page.)

*Primary Examiner*—Edward P. Westin
*Assistant Examiner*—Richard Hanig
*Attorney, Agent, or Firm*—Blakely, Sokoloff, Taylor & Zafman

[57] ABSTRACT

A method and an apparatus for detecting an electric field in the active regions of an integrated circuit disposed in a semiconductor. In one embodiment, a laser beam is operated at a wavelength near the band gap of a semiconductor such as silicon. The laser beam is focused onto a P-N junction, such as for example the drain of an MOS transistor, through the back side of the semiconductor substrate. As a result of photo-absorption, the laser beam is partially absorbed in the P-N junction. When an external electric field is impressed on the P-N junction, such as when for example the drain of the transistor switches, the degree of photo-absorption will be modulated in accordance with the modulation in the electric field due to the phenomenon of electro-absorption. Electro-absorption also leads to electro-refraction which leads to a modulation in the reflection coefficient for the light reflected from the P-N junction/oxide interface. The laser beam passes through the P-N junction region, reflects off the oxide interface and metal behind the junction, and returns back through the P-N junction and back out of the silicon surface. Any amplitude modulation in this reflected laser beam is detected with an optical detection system, and is attributed to a corresponding modulation in the electric field in the P-N junction due to the combined effects of electro-absorption and electro-refraction.

29 Claims, 9 Drawing Sheets

OTHER PUBLICATIONS

H. K. Heinrich et al., Optical Detection of Multibit Logic Signals at Internal Nodes in a Flip–Chip Mounted Silicon Static Random–Access Memory Integrated Circuit, American Vacuum Society, p. 3109–3111 (1992).

J.I. Pankove, Optical Processes in Semiconductors, Dovers Publications, Inc. (1971).

A. Black et al., Optical Sampling of GHz Charge Density Modulation in Silicon Bipolar Junction Transistors, Electronics Letters 23 (15) (1987).

A.A. Gutken and F.E. Faradzhev, Influence of the Polarization of Light on the Electroabsorption in Silicon, Soviet Physics 6 (9) (1973).

A.A. Gutkin et al., Influence of the Orientation of the Electric Field on the Polarization of Dependence of the Electroabsorption in Silicon, Sov. Phys. Semicond. 8 (6) (1974).

I.A. Merkulov, Polarization Effects in the Electroabsorption in Silicon, Sov. Phys. Semicond. 7 (11) (1974).

A. Frova et al., Electro–Absorption Effects at the Band Edges of Silicon and Germanium, Physical Rev. 145 (2) (1966).

R.A. Soref and B.R. Bennett, Electrooptical Effects in Silicon, IEEE J. Quantum Electron., QE–23 (1) (1987).

H.K. Heinrich et al., Picosecond Backside Optical Detection of Internal Signals in Flip–Chip Mounted Silicon VLSI Circuits, Microelectronic Engineering, 16 (1992).

H.K. Heinrich et al., Measurement of Real–Time Digital Signals in a Silicon Bipolar Junction Transistor Using a Noninvasive Optical Probe, Electronics Letters, 22 (12) (1986).

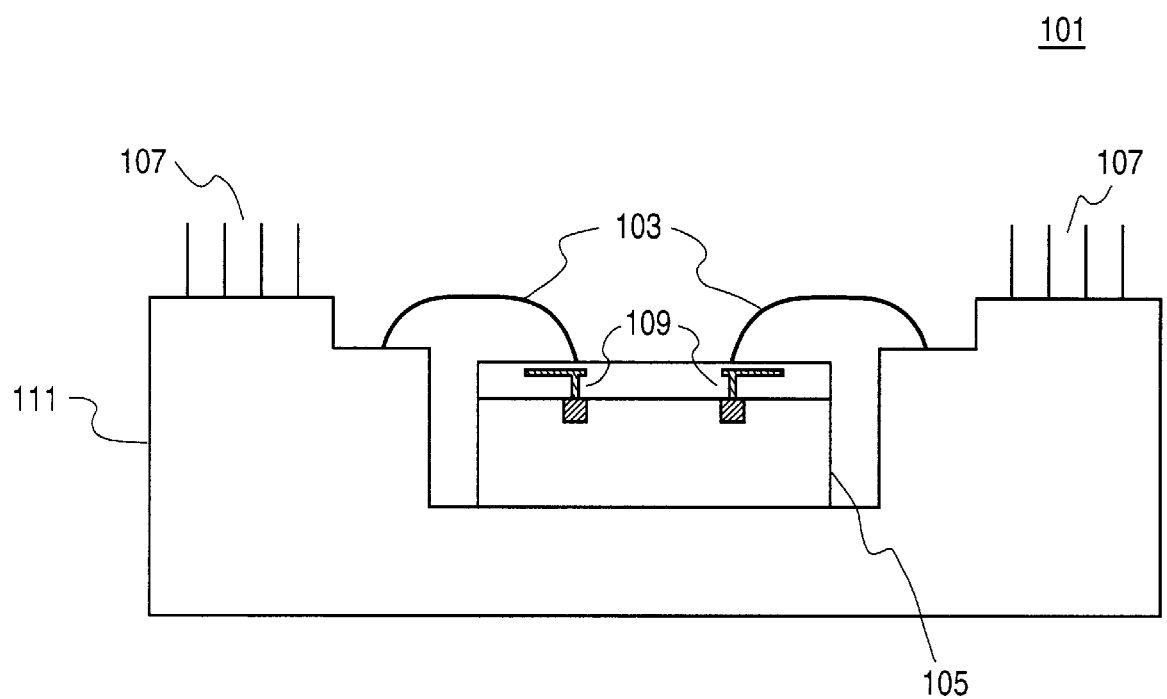
FIG_1A (PRIOR ART)

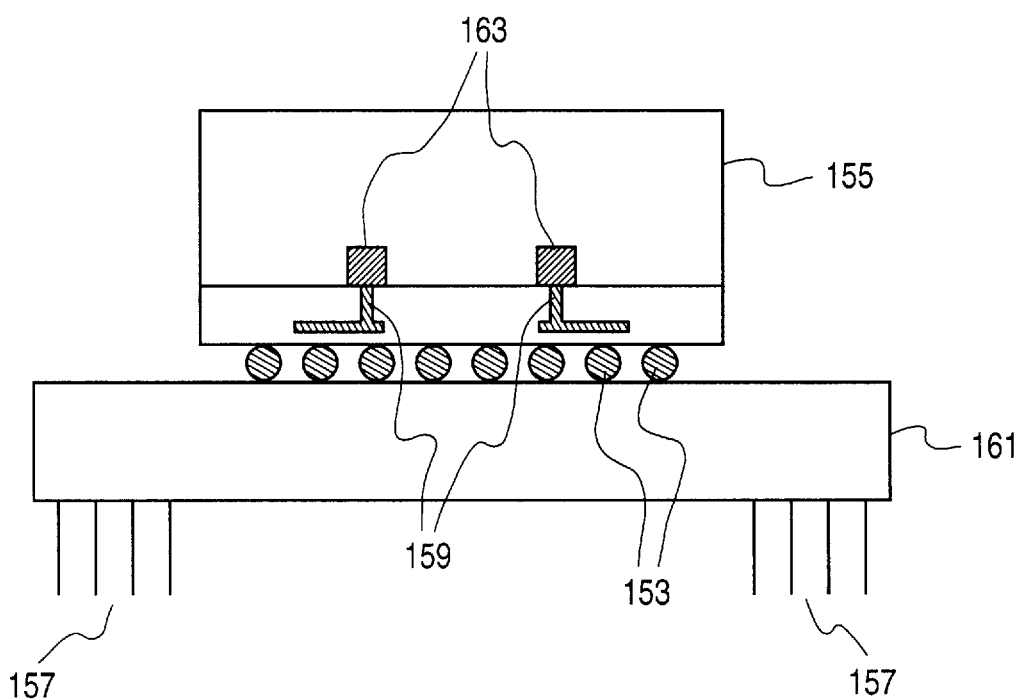
FIG_1B (PRIOR ART)

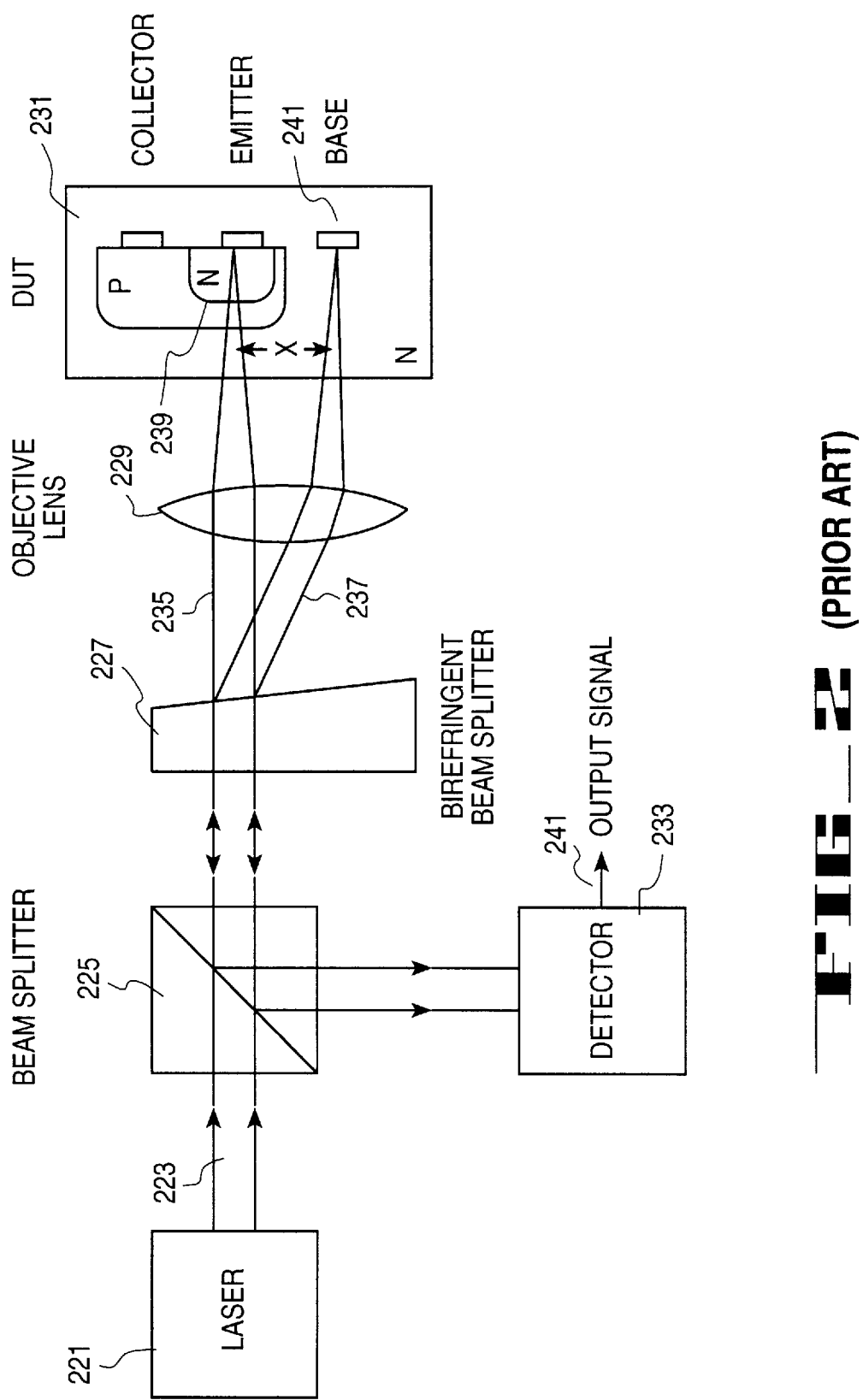
FIG_2 (PRIOR ART)

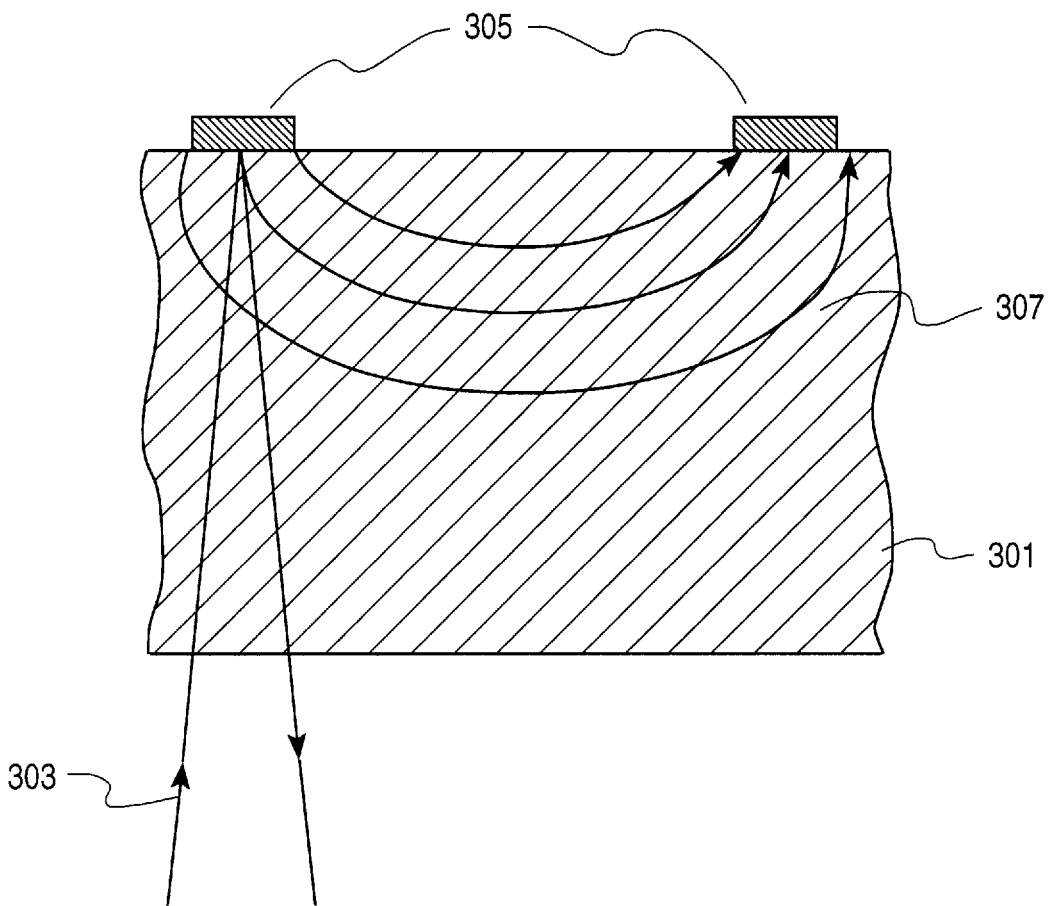
FIG_3 (PRIOR ART)

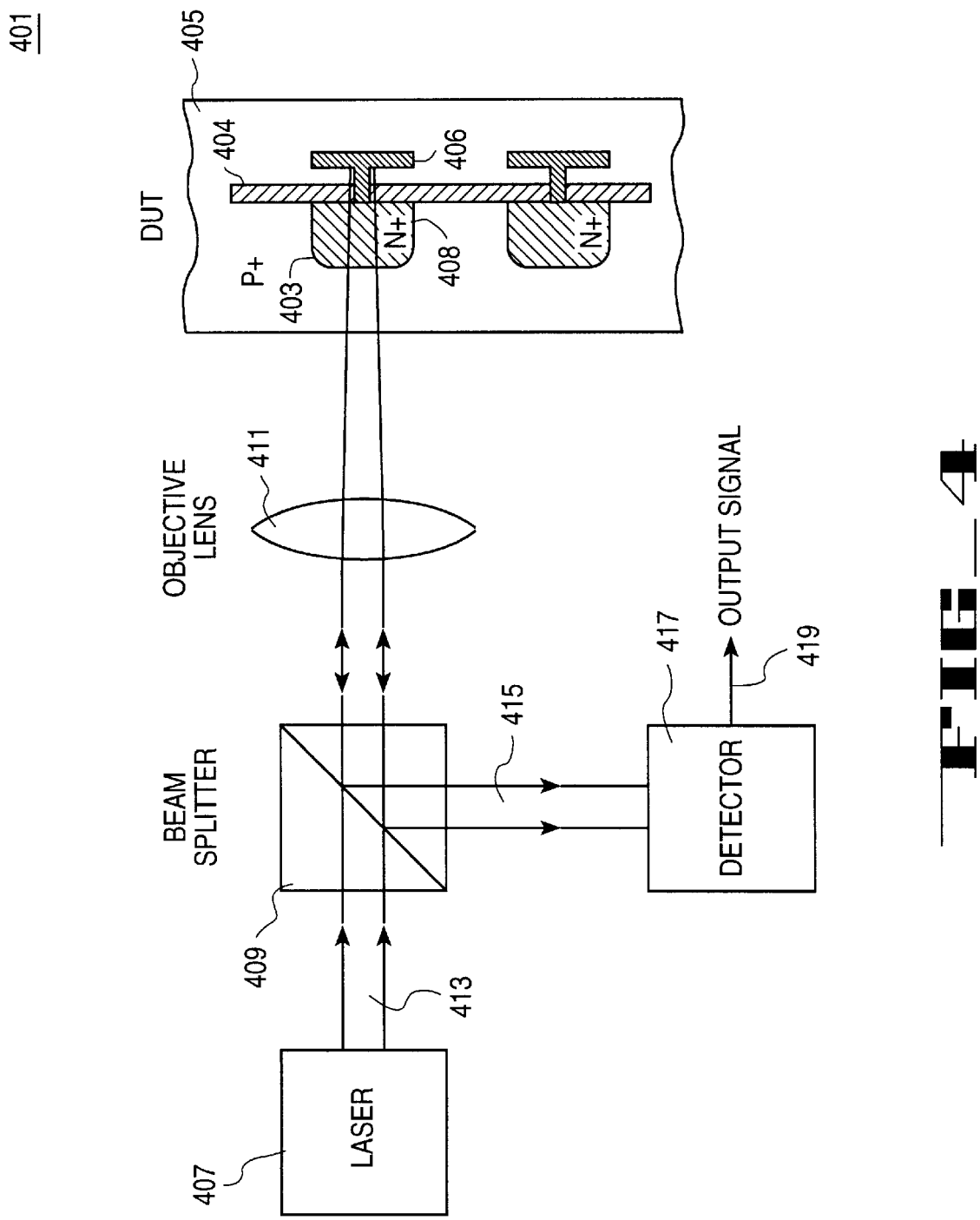
FIG_4

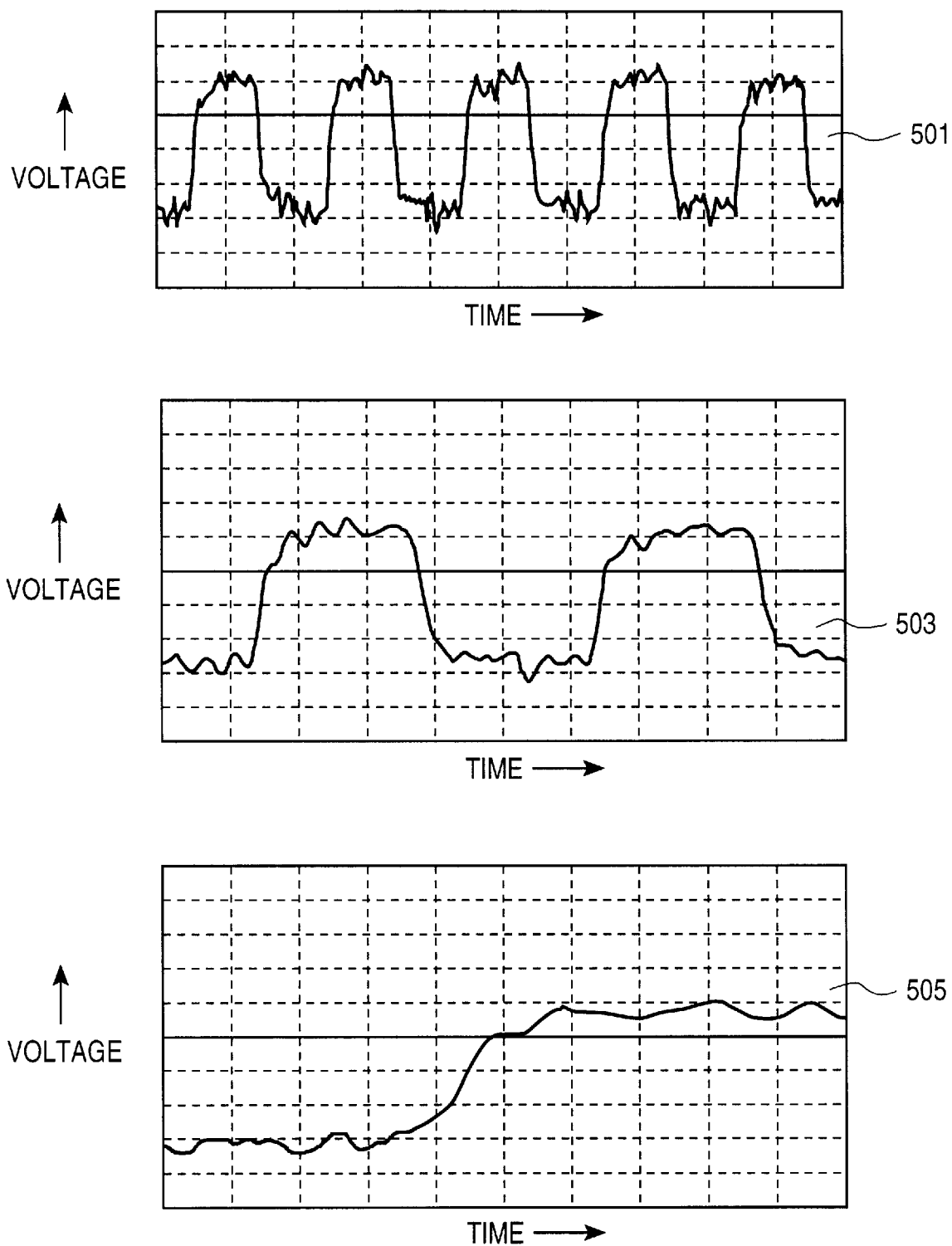
FIG_5

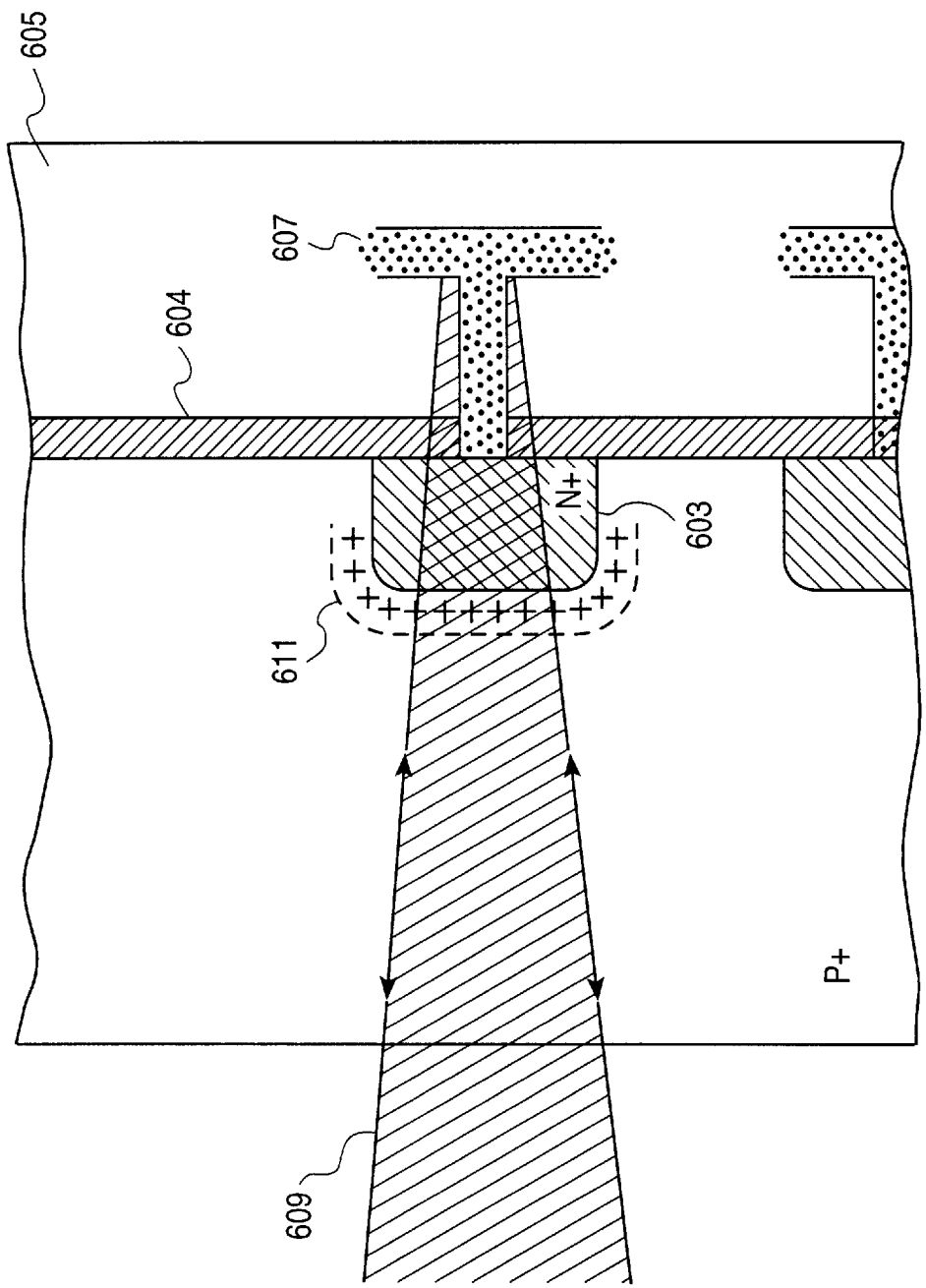
FIG_6

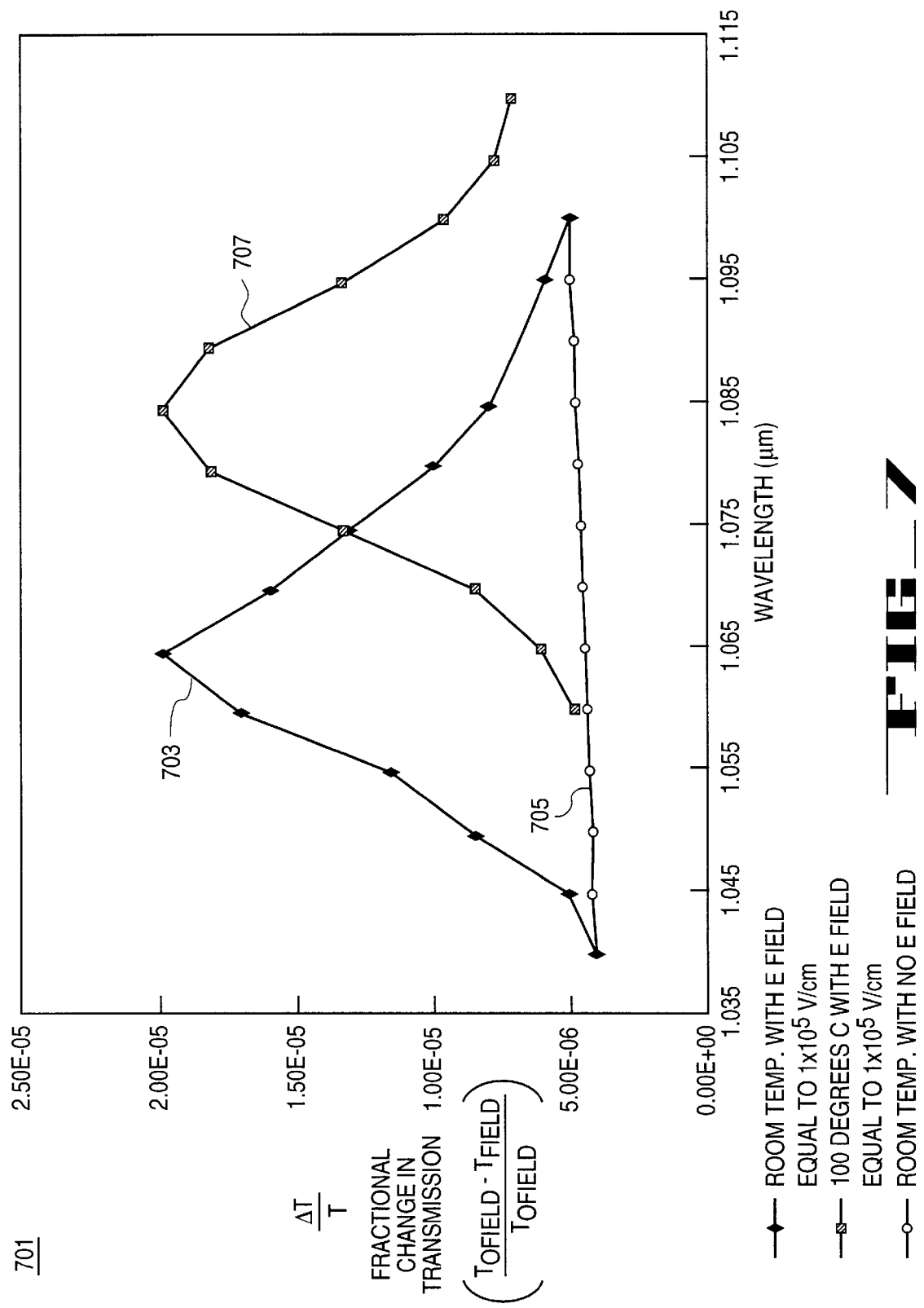

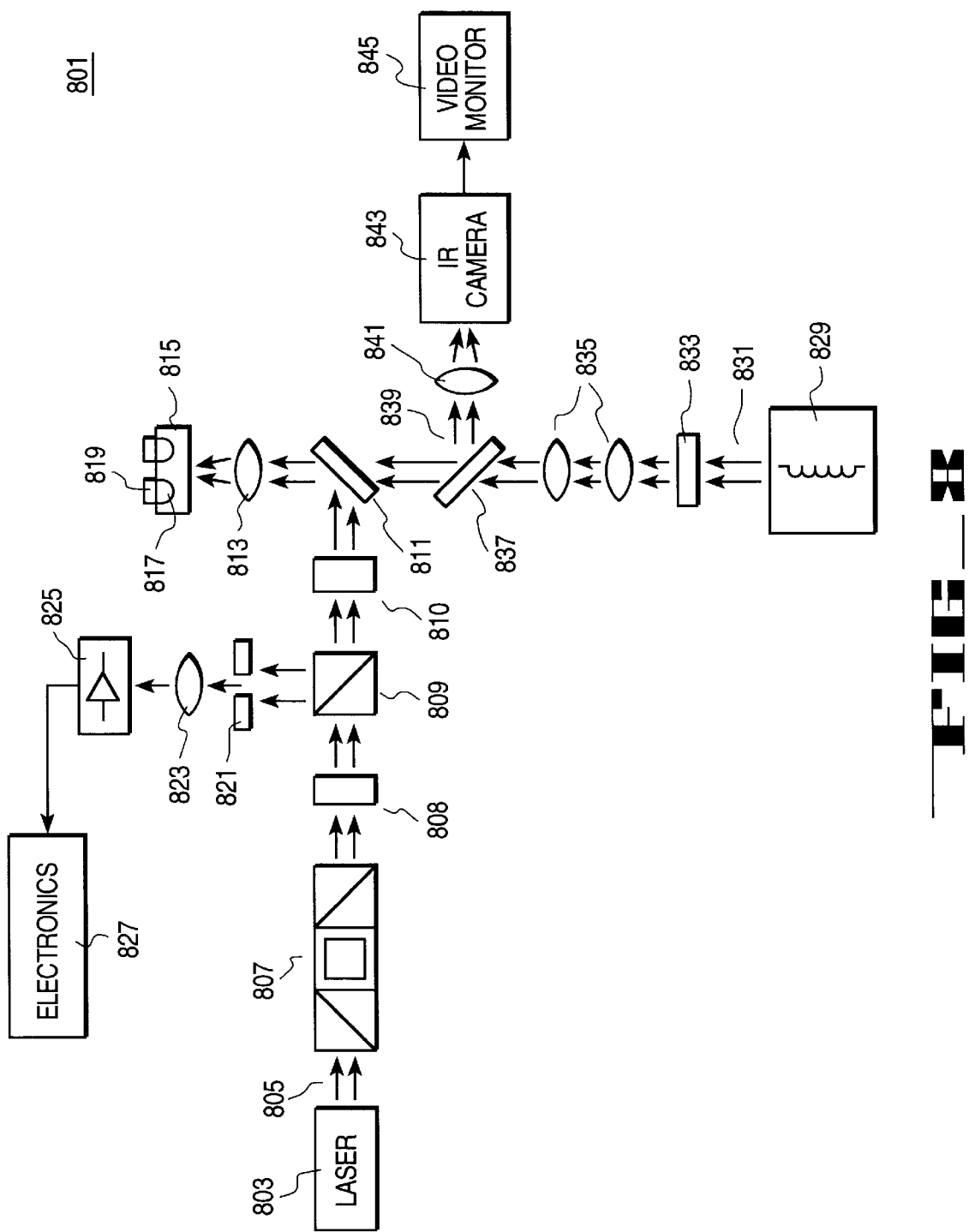
FIG. X

METHOD AND APPARATUS USING AN INFRARED LASER BASED OPTICAL PROBE FOR MEASURING ELECTRIC FIELDS DIRECTLY FROM ACTIVE REGIONS IN AN INTEGRATED CIRCUIT

BACKGROUND OF THE INVENTION

1. Field of the Invention

The present invention relates generally to integrated circuit testing and, more specifically, the present invention relates to optical-based probing of integrated circuits.

2. Description of the Related Art

Within the integrated circuit industry there is a continuing effort to increase integrated circuit speed as well as device density. As a result of these efforts, there is a trend towards using flip chip technology when packaging complex high speed integrated circuits. Flip chip technology is also known as control collapse chip connection (C4) packaging. In C4 packaging technology, the integrated circuit die is flipped upside down. This is opposite to how integrated circuits are packaged today using wire bond technology. By flipping the die upside down, ball bonds may be used to provide direct electrical connections from the bond pads directly to the pins of the C4 package.

FIG. 1A illustrates integrated circuit packaging 101 which utilizes wire bonds 103 instead of ball bonds to electrically connect integrated circuit connections in integrated circuit die 105 through metal interconnects 109 to the pins 107 of package substrate 111. With the trend towards high speed integrated circuits, the inductance generated in the wire bonds 103 of the typical integrated circuit packaging 101 becomes an increasingly significant problem.

FIG. 1B illustrates C4 packaging 151 with the integrated circuit die 155 flipped upside down. In comparison with the wire bonds 103 of FIG. 1A, the ball bonds 153 of C4 packaging 151 provide more direct connections between the integrated circuit die 155 and the pins 157 of package substrate 161 through metal interconnects 159. As a result, the inductance problems associated with typical integrated circuit packaging technologies that use wire bonds are minimized. Unlike wire bond technology, which only allows bonding along the periphery of the integrated circuit die, C4 technology allows connections to be placed anywhere on the integrated circuit die surface. This leads to a very low inductance power distribution to the integrated circuit which is another major advantage of C4.

A consequence of the integrated circuit die 155 being flipped upside down in C4 packaging 151 is that access to internal nodes of the integrated circuit die 155 for testing purposes has become a considerable challenge. In particular, during the silicon debug phase of a new product that is designed to be packaged into C4, it is often necessary to probe electrical signals from internal nodes of the chip, insitu, while the chip is packaged in its native C4 packaging environment. During the debug process it is often necessary to probe certain internal nodes in order to obtain important electrical data from the integrated circuit. Important data include measuring device parameters such as, but are not limited to, voltage levels, timing information, current levels and thermal information.

Present day debug process for wire bond technology is based on directly probing the metal interconnects on the chip front side with an electron beam (E-beam) or mechanical prober. Typical integrated circuit devices have multiple layers of metal interconnects and it is often difficult to access nodes that are buried deep in the chip. Usually other tools such as plasma etchers and focused ion beam systems must be used to mill away the dielectric and or metal above the node to expose nodes for probing.

With C4 packaging technology, however, this front side methodology is not feasible since the integrated circuit die is flipped upside down. As illustrated in FIG. 1B, access to the metal interconnects 159 for the purpose of conventional probing is obstructed by the package substrate 161. Instead, the P-N junctions forming the active and passive regions 163 of the integrated circuit are accessible through the back side of the silicon substrate of integrated circuit die 155.

FIG. 2 illustrates a prior art method used to probe active diffusion regions in integrated circuits. In the setup shown in FIG. 2, a device under test (DUT) 231 includes an active region 239 and non active region (metal) 241. A laser 221 is positioned to focus a laser beam 223 through a beam splitter 225, a birefringent beam splitter 227 and an objective lens 229 through the back side of the silicon of DUT 231 on the diffusion region 239 and metal 241. As shown in FIG. 2, birefringent beam splitter 227 separates the laser beam 223 into two separate laser beams, a probe laser beam 235 and reference laser beam 237. Both probe laser beam 235 and reference laser beam 237 are reflected from active region 239 and metal 241, respectively, back through objective lens 229 into birefringent beam splitter 227. Probe laser beam 235 and reference laser beam 237 are then recombined in birefringent beam splitter 227 and are guided into detector 233 through beam splitter 225.

By operating the DUT 231 while focusing probe laser beam 235 on active region 239 and reference laser beam 237 on metal 241, waveforms may be detected with detector 233 through the silicon substrate of DUT 231. Detection is possible due to the plasma-optical effect in which the refractive index of a region of free charge is different to a region with no charge. The application of a bias causes the free charge, and hence the refractive index, in the probed region to be modulated whereas the refractive index of the region under the reference beam is unaltered. This results in phase shift between probe beam 235 and reference beam 237.

Accordingly, by measuring the phase difference between the reflected reference beam 237 and probe laser beam 235, detector 233 is able to generate an output signal 241 that is proportional to the charge modulation caused by operation of the P-N junction region under the probe. This optical measurement can then be combined with conventional stroboscopic techniques to measure high frequency charge and hence voltage waveforms from the P-N junction region 239.

There are a number disadvantages with the prior art technique shown in FIG. 2. First, being a phase detection scheme, two beam beams are required (a reference beam 237 and a probe beam 235) to interfere with each other to generate the phase signal. These beams are created with birefringent beam splitter 227. Therefore, use of both probe laser beam 235 and reference laser beam 237 is limited in that they must be separated by a distance of x as shown in FIG. 2. Consequently, the layout of the diffusion regions 239 and metals 241 in DUT 231 must be such that a metal 241 is located at a distance x from diffusion region 239. It is appreciated that many modern integrated circuit layouts may not lend themselves to be probed with a setup as shown in FIG. 2 since the prior art technique shown requires a reflective surface 241 with no charge modulation ahead of it for the reference beam to be in close proximity (a distance x) to the probed region 239 undergoing charge modulation. It is difficult to meet these requirements in today's advanced technologies.

In addition, it is noted that the technique shown in FIG. 2 has only been applied to bipolar junction transistor technology and that no successful applications of the prior art technique shown in FIG. 2 have been used with CMOS technology. This is because the charge modulation in the depletion region of a reverse biased P-N junction (e.g. the drain of an MOS transistor) is much smaller than the charge modulation in the same junction when it is forward biased (e.g. the base region of a bipolar junction transistor). Furthermore, since the channels of MOS devices are lateral whereas the base-emitter junctions of bipolar devices are vertical, direct measurement of charge modulation in the channel of an MOS device is not possible due to prohibitively small laser spot size required which is far below that of the wavelength of light in silicon.

Another prior art optical technique for probing integrated circuits utilizes the electro-optic effect or Pockels effect. This electro-optic effect involves measuring the change in the optical index of refraction that occurs in an asymmetrical crystal when an electric field is applied. The refractive index of electro-optic materials changes when an electric field is applied. As a result, the polarization of an optical beam passing through the electro-optic material then changes according to the strength of the electric field or voltage impressed across the electro-optic material.

FIG. 3 illustrates an application of the electro-optic effect to an integrated circuit utilizing an asymmetrical crystal such as a gallium arsenide substrate 301. In the illustration shown in FIG. 3, a fringing electric field 307 exists between electrodes 305. A probe beam 303 enters from the back side of substrate 301, passes through the fringing electric field 307 and is reflected from an electrode 305. By measuring the changes in polarization of probe beam 303 and thus changes in the refraction index of the substrate 301, the electric field 307 can be measured. It is appreciated, however, that although this technique may be utilized in gallium arsenide based integrated circuits, electro-optic sampling in silicon is not possible because silicon is a symmetrical crystal and hence does not exhibit the electro-optic or Pockels effect.

Therefore, what is desired is a method and an apparatus for probing active regions in CMOS integrated circuits through the back side of silicon. Such a method should be able to probe active regions of a CMOS integrated circuit through the back side of silicon without the need for reference laser beam to be reflected off a metal near the diffusion region to be probed. In addition, this method should be compatible present day CMOS integrated circuit technology.

SUMMARY OF THE INVENTION

A method and an apparatus for detecting an electric field in an active region of an integrated circuit disposed in a semiconductor is disclosed. In one embodiment, a laser beam is operated at a wavelength near the band gap of the semiconductor. The laser beam is then focused on the active region through the back side of the semiconductor. Amplitude modulation in the reflected laser beam from the active region is detected and is then attributed to the electric field in the active region of the semiconductor. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

FIG. 1A is an illustration showing present day wire bond technology.

FIG. 1B is an illustration showing flip chip or C4 packaging technology.

FIG. 2 is a diagram of a prior art method of probing an active region through the back side of silicon bipolar junction transistor using two laser beams and measuring the phase shift due to charge density modulation of one of the laser beams with respect to the other laser beam.

FIG. 3 is a diagram of a prior art method of optical probing integrated circuits using the electro-optic effect used in gallium arsenide substrate.

FIG. 4 is a diagram of an active region being probed using a single laser beam in accordance with the teachings of the present invention.

FIG. 5 is an illustration showing various waveforms which may be generated using the present invention.

FIG. 6 is an illustration of a depletion region in a P-N junction being probed by a single laser beam in accordance with the teachings of the present invention.

FIG. 7 is a graph illustrating plots of the measured electro-absorption as a function of wavelength in a highly doped silicon substrate with a high electric fields applied across the substrate and measured at various temperatures.

FIG. 8 is a diagram of another embodiment of the present invention that probes and monitors an active region in accordance with the teachings of the present invention.

DETAILED DESCRIPTION

A method and an apparatus for detecting an electric field in an active region of an integrated circuit disposed in a semiconductor is disclosed. In the following description numerous specific details are set forth, such as for example wavelengths and energy values, in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

The present invention provides a method and apparatus for measuring electric fields, and hence voltages, directly from an active region of an integrated circuit with a focused infrared (IR) laser beam through the back side of a semiconductor such as silicon. One embodiment of the present invention directly probes integrated circuit active regions through the silicon back side of the chip using infrared laser based techniques. Since silicon is partially transparent to infrared light, one can focus the infrared laser beam through a partially thinned silicon integrated circuit to directly reach the active regions.

FIG. 4 shows an embodiment of the present invention which allows an integrated circuit active region 403 to be probed through the back side of a semiconductor in accordance with the teachings of the present invention. A laser 407 is positioned to provide a laser beam 413 which is focused on an active region 403. Laser beam 413 passes through a beam splitter 409 and an objective lens 411 which focuses the laser beam 413 on active region 403. Laser beam 413 passes through the substrate and active region 403, reflects off the contact/metal behind the active region and passes back through the active region 403 and the substrate. The reflected laser beam 415 returns back through objective lens 411 and is guided into detector 417 through beam splitter 409. Detector 417 generates an output signal 419 which corresponds to the electric field in the active region 403. As will be discussed in greater detail below, detector 417 is included in an optical detection system which detects amplitude modulations in reflected laser beam 415 and attributes the modulations in amplitude to the electric field in the active region 403.

As shown in FIG. 4, active region 403 is included in device under test (DUT) 405. In one embodiment, DUT 405 is a CMOS integrated circuit disposed in silicon in a C4 packaged product. Since the presently described technique detects amplitude modulation as opposed to phase modulation in the reflected beam, the need for a reference beam for the interferometric phase detection is eliminated. In one embodiment of the present invention, DUT 405 is partially thinned to a thickness of approximately 100 to 200 $\mu$m before probing, to allow increased transmission of laser beam 413 through the highly doped silicon substrates, as used in modern VLSI integrated circuits, and correspondingly increases the reflected laser beam 415 returning through the back side of the silicon of DUT 405. In one embodiment of the present invention, laser 407 is a mode locked laser operating at a wavelength of approximately 1.064 $\mu$m.

Operation of the present invention is as follows. Assume a focused laser beam 413 of power P impinges on a P-N junction 403. If the energy of the photons of laser beam 413 is greater than or equal to the band gap energy of the silicon of DUT 405, there will be some photo-absorption $\Delta P$ of the laser beam in the P-N junction. $\Delta P$ and P are related by the fundamental absorption coefficient $\alpha$ as given by:

$$\Delta P = \alpha P \quad \text{(Equation 1)}$$

When an electric field E is then applied to the P-N junction, a mechanism known as electro-absorption modulates $\alpha$—the photo-absorption. The power absorbed in the P-N junction then becomes:

$$\Gamma(E) \cdot \Delta P \quad \text{(Equation 2)}$$

where $\Gamma(E)$ is the functional relationship between electro-absorption and the electric field.

When the laser 413 reflects off a non-active region, such as for example a metal pad, the laser power detected by detector 417 is $P_0$. If the same laser beam 413 is moved onto an active region 403 the laser power then seen by the detector is reduced by $\Delta P_0$ to $P-\Delta P_0$ due to photo-absorption in the P-N junction. When an AC electric field E(t) is applied to the P-N junction, the laser power seen by the detector 417 will now be:

$$P_0 - \Gamma[E(t)] \cdot \Delta P_0 \quad \text{(Equation 3)}$$

where as before, $\Gamma$ is the functional relationship between electro-absorption and the electric field E(t). Thus, by measuring, with detector 417 the AC component of the detected signal, the electric field, and hence the voltage, modulation can be recovered. The unknown function $\Gamma$ is determined through calibration.

Since the P-N junction region is separated from the metal region 406 behind it with an oxide film 404, the probing laser beam will be reflected both from the metal 406 and the oxide-active region interface 408. The latter arises because the refractive index of the silicon forming the P-N junction and oxide are different. In addition to electro-absorption, there is also electro-refraction, which leads to a modulation in the refractive index in the P-N junction as a function of the electric field. Thus, the portion of the reflected laser beam that originated at the oxide-P-N junction interface will also be modulated due to this effect. This effect is smaller than the electro-absorption effect. The two effects combine to give an overall amplitude modulation in the reflected laser power as seen by the detector 417.

FIG. 6 is an illustration having increased detail of an active region 603 in a DUT 605. In one embodiment of the present invention, active region 603 is an N-doped diffusion in a P-doped silicon substrate. Conversely, it is appreciated that another embodiment of the present invention may utilize a P-doped active region in an N-doped substrate. Laser beam 609 is shown passing through the back side of the silicon of DUT 605 into active region 603 through oxide film 604 and reflecting from metal 607 back out of the back side of the silicon of DUT 605. In the embodiment shown in FIG. 6, laser beam 609 is an infrared laser beam and is therefore able to pass through the silicon of DUT 605 since silicon is partially transparent to infrared light.

When a bias is applied to active region 603, a depletion region 611 is increased at the P-N junction interface between active region 603 and the silicon substrate of DUT 605. With the high doping densities of the active areas, region 603 and substrate of DUT 605, the depletion region 611 at the P-N junction interface is very narrow. In one embodiment of the present invention, depletion region 611 is only about 70 nm thick. Therefore, when a typical integrated circuit operating voltage is applied across such a narrow depletion region 611, a high electric field, such as for example approximately $1 \times 10^5$ volts per centimeter, is produced across the depletion region 611 as a result. This high electric field increases the tunneling probability, which in turn leads to an increase in the fundamental absorption coefficient. This effect is also known as electro-absorption or the Franz-Keldysh effect.

The modulation of the photo-absorption of the laser beam 609 depends on the modulation of the electric field applied at the junction. This modulation in the absorption of the laser beam is the signal of interest since it is related to the voltage applied to the junction.

In addition, electro-absorption also leads to electro-refraction. That is, the effects of electro-absorption and electro-refraction are linked. Electro-refraction leads to change in refractive index. This means that at the same time, the refractive index change leads to a modulation in the reflection coefficient for light reflected from the junction/oxide interface. This modulation is superimposed upon the modulation due to electro-absorption and the photodetector actually measures the total amplitude modulation due to both effects.

The present invention utilizes detector 417 of FIG. 4 to simultaneously detect both the effects of electro-absorption and electro-refraction caused by the applied electric field. Both these effects cause power modulation in the reflected laser beam 415. Detector 417 converts these modulations into output signal 419. The degree of the amplitude modulation is related to the applied electric field (i.e. voltage) across the P-N junction, by the function $\Gamma$ of Equation 2. $\Gamma$ is determined through calibrating the detector output to known applied voltages. By operating the DUT 405 while focusing laser beam 413 on an active region 403, electrical waveforms similar to waveforms 501, 503 and 505 of FIG. 5 may be detected with detector 417 through the substrate of DUT 405 which correspond to varying voltages applied to active region 403. This optical measurement can then be combined with conventional stroboscopic techniques to measure high frequency voltage waveforms from the active region 403.

FIG. 7 is a graph 701 illustrating plots of the measured electro-absorption as a function of wavelength in a highly doped silicon substrate with a high electric field applied across the substrate and measured at various temperatures. Plots 703, 705 and 707 of graph 701 show the measured change in transmission over the total transmission of the photons of an infrared beam passing through a doped silicon substrate as a function of photon wavelength. Specifically, plot 703 shows the change in transmission over total transmission through a thinned silicon substrate versus wavelength with an externally applied electric field of approximately $1 \times 10^5$ volts per centimeter applied to the silicon substrate at room temperature. As can be seen from FIG. 7, there is a peak electro-absorption at approximately 1.064 $\mu$m. Plot 705 shows the relationship of change in transmission over total transmission of photons versus wavelength through the same thinned silicon substrate with no electric field applied at room temperature. As shown in FIG. 7, there is no corresponding electro-absorption peak in plot 705 at 1.064 $\mu$m. FIG. 7 demonstrates the effect that a high electric field has on the electro-absorption characteristics in silicon. The magnitude of the electro-absorption is directly related to the magnitude of the electric field in the silicon. By calibrating this functional relationship one can extract the applied voltage applied to the P-N junction.

With the doping levels of the silicon sample utilized in plots 703 and 705, one embodiment of the present invention measures electro-absorption by implementing an infrared, high frequency, mode locked laser operating at a wavelength which corresponds with the peak in plot 703. The optics of the embodiment of the present invention focus the mode locked laser pulses onto the active regions to be probed. The probing system consists of a single beam that is focused through the back side of the silicon of a fully C4 packaged integrated circuit into the N diffusion regions located in a P substrate. It is appreciated that the present invention may also be employed with integrated circuits having P diffusion regions located in an N substrate. The laser beam passes through the P-N junction interface, reflects off the front side metal, and returns back through the P-N junction region and back out of the silicon surface.

When a bias is applied across the P-N junction, an electric field results across the P-N junction interface. Plot 703 illustrates how some of the photons will be absorbed due to electro-absorption. The change in transmission over total transmission will be approximately $2 \times 10^{-5}$ at a wavelength of 1.064 $\mu$m. If no electric field is applied, the photon absorption will be reduced. By operating the DUT while focusing probe laser beam on the active region to be probed, electrical waveforms which correspond to varying voltages applied to the diffusion region may be detected and generated using a photo detector in accordance with the teachings of the present invention.

It is appreciated that the band gap of silicon decreases with both increasing doping concentration and with increasing temperature. For instance, it is noted that the band gap decreases by approximately 30 meV at 100 degrees Celsius for highly doped silicon. Accordingly, corresponding plot 707 shows the change in transmission over total transmission through the silicon substrate versus wavelength with an externally applied electric field of approximately $1 \times 10^5$ volts per centimeter at 100 degrees Celsius. It can be seen by plot 707 that the electro-absorption peak has accordingly moved to approximately 1.085 $\mu$m due to the increase in temperature.

If the integrated circuit being probed operates at an elevated temperature, the peak in the measured photo-absorption moves to longer wavelengths as shown by comparing plots 703 and 707 of FIG. 7. As a result, one embodiment of the present invention is not limited to using a mode locked laser having a fixed wavelength of 1.064 $\mu$m. Instead, the embodiment of the present invention employs a tunable mode locked laser that can be varied or adjusted with temperature or other conditions which may change the band gap of the semiconductor material. By enabling the wavelength of the mode locked laser to follow and match the peaks of plots 703, 707 or the like, the signal to noise ratio of one embodiment of the present invention is continuously optimized. It is noted that the transmission of an infrared laser in silicon decreases as a function of temperature. It is also appreciated that other techniques for compensating for the decrease in transmission of an infrared laser in silicon due to temperature may be employed to optimize the signal to noise ratio.

In one embodiment of the present invention, DUT 405 is run and operated in a tester environment on a tester apparatus (not shown) when the output waveforms are generated. In another embodiment of the present invention, DUT 405 may be run and operated in a system environment, such as for example on a computer motherboard, when the output waveforms are generated. That is, laser beam 413 is focused directly onto diffusion region 403 and waveforms such as waveforms 501, 503 and 505 may be obtained while DUT 405 is mounted and operating in an actual system. As a result, one embodiment of present invention enables the debugging of C4 packaged integrated circuits while the parts are operating on a tester apparatus or in a system environment.

It is appreciated that the present invention may obtain waveforms from DUT 405 in other types of test environments so long as laser beam 413 is focused onto active region 403 through the back side of the semiconductor substrate while DUT 405 is operated. All this is possible because the DUT is not limited to being operated in a vacuum as opposed to an E-Beam probing environment, which requires the DUT to operate in vacuum. It is noted that it is impractical to probe a DUT operating in a system environment such as on a large PC board using a conventional E-beam probe because the vacuum chamber of the E-beam probe would be required to be prohibitively large to accommodate the large PC board. However, since the present invention does not require the DUT to be in a vacuum chamber, waveforms can now be obtained in a variety of operating environments.

FIG. 8 is a diagram of another embodiment 801 of the present invention. A mode locked laser 803 operating at 1.064 $\mu$m produces a laser beam 805 which passes through optical isolator 807, through $\lambda/2$ half wave plate 808, through polarizing beam splitter 809, through $\lambda/4$ quarter wave plate 810, through dichroic beam splitter 811 and through objective lens 813 is focused onto diffusion region 817 through the back side of the silicon of DUT 815.

The laser beam 805 is reflected off the front side metal 819 back through objective lens 813 and is guided to aperture 521 with dichroic beam splitter 811, $\lambda/4$ quarter wave plate 810 and polarizing beam splitter 809. The reflected laser beam 805 is directed by aperture 821 through focusing lens 823 into photo diode 825. Photo diode 825 is coupled to electronics 827 to detect the amplitude modulation of photons in the reflected laser beam from DUT 815 to determine the presence of electric field at diffusion region 817.

Optical isolator 807 is used to minimize the number of photons reflected back into laser 803. The $\lambda/2$ half wave plate 808 and $\lambda/4$ quarter wave plate 810 are used in conjunction with polarizing beam splitter 809 to increase the percentage transmission of laser beam 805 to DUT 815 as well as increase the percentage transmission of laser beam 805 reflected from the DUT 815 to aperture 821 to optimize the signal to noise ratio.

The embodiment 801 shown in FIG. 8 also includes imaging elements for monitoring, including a tungsten illumination source 829 which generates light 831 which is directed through infrared filter 833, through collimating lenses 835, through beam splitter 837, through dichroic beam splitter 811, and objective lens 833 onto diffusion region 817 through the back side of the silicon of DUT 815. The light 831 is reflected from DUT 815 back through the objective lens 813, through dichroic beam splitter 811 into infrared camera 843 through beam splitter 837 and focusing lens 841. The reflected light 839 allows imaging of the back side of the DUT 815 with infrared camera 843. A video monitor 845 is coupled to infrared camera 843 to observe the images of the back side of the silicon of DUT 815. This enables direct observation of diffusions insitu while focusing laser into diffusions needed to be probed.

In yet another embodiment of the present invention, laser 803 may also be configured to act as a scanning laser light source. In this embodiment, a laser spot is scanned or rastered across the back side of DUT 815 for imaging purposes. In the embodiment, laser light reflected from DUT 815 is transmitted to infrared camera 843 so that an image of DUT 815 may be observed on video monitor 845. In the embodiment, the optical detection system is a confocal based optical system.

Thus, what has been described is a method and an apparatus for detecting an electric field at a diffusion region of an integrated circuit disposed in a semiconductor without having to mill the substrate to expose a diffusion region or supply a second laser beam to be used as a reference beam. With the presently described infrared laser based optical probe, a technique for measuring voltages and electric fields directly from diffusion regions through the back side of silicon on a C4 mounted integrated circuit is provided.

In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method for detecting an electric field in an integrated circuit, the method comprising the steps of:
   operating a laser beam at a wavelength near a band gap of a semiconductor of the integrated circuit;
   focusing the laser beam through a back side of the semiconductor on an active region of the semiconductor;
   detecting an amplitude modulation of a reflected laser beam from the active region through the back side of the semiconductor; and,
   attributing the amplitude modulation of the reflected laser beam to the electric field in the active region of the semiconductor.

2. The method described in claim 1 including the additional step of adjusting the wavelength in response to a change in the band gap of the semiconductor.

3. The method described in claim 1 including the additional step of generating an output waveform in response to the amplitude modulation of the reflected laser beam.

4. The method described in claim 1 wherein the semiconductor comprises silicon.

5. The method described in claim 1 wherein the active region comprises an N diffusion region disposed within a P substrate.

6. The method described in claim 1 wherein the active region comprises a P diffusion region disposed within an N substrate.

7. The method described in claim 1 wherein the semiconductor is comprised in a fully packaged integrated circuit.

8. The method described in claim 7 wherein the fully packaged integrated circuit is a control collapse chip connection mounted integrated circuit.

9. The method described in claim 7 including the additional step of operating the fully packaged integrated circuit on a tester apparatus.

10. The method described in claim 7 including the additional step of operating the fully packaged integrated circuit on a printed circuit board.

11. The method described in claim 1 wherein the detecting step includes the step of reflecting the laser beam off a front side metal disposed near the active region.

12. The method described in claim 1 including the additional step of thinning the semiconductor to approximately 100 to 200 $\mu$m before the step of focusing the laser beam on the active region through the back side of the semiconductor.

13. The method described in claim 1 wherein the detecting step includes the step of applying a bias across the active region of the integrated circuit.

14. The method described in claim 1 wherein the integrated circuit is a CMOS integrated circuit.

15. The method described in claim 1 wherein the laser beam is a mode locked laser beam.

16. The method described in claim 1 wherein the detecting step includes the step of guiding the reflected laser beam into an optical detection system.

17. The method described in claim 1 including the additional step of illuminating the active region through the back side of the semiconductor with a light source.

18. The method described in claim 17 wherein the light source is the laser beam, wherein the step of illuminating the active region includes the step of rastering the laser beam across the active region.

19. The method described in claim 18 wherein the optical detection system is a confocal based optical system.

20. The method described in claim 1 including the additional step of monitoring the active region through the back side of the semiconductor with a camera coupled to a video monitor.

21. A device for detecting an electric field in an integrated circuit, comprising:
   a laser configured to provide a laser beam at a wavelength near a band gap of a semiconductor of the integrated circuit;
   an objective lens positioned in front of the laser so as to focus the laser beam on an active region of the integrated circuit through a back side of the semiconductor;
   a beam splitter positioned between the laser and the objective lens; and,
   a detector positioned to detect a reflected laser beam reflected from the active region through a back side of the semiconductor, through the objective lens and through the beam splitter, the detector configured to detect an amplitude modulation of the reflected laser beam wherein the amplitude modulation is attributable to the electric field at the active region.

22. The device described in claim 21 wherein the amplitude modulation is further attributable to photo-absorption and reflectance modulation of the laser beam in the active region.

23. The device described in claim 21 further comprising an optical isolator positioned between the laser beam and the beam splitter.

24. The device described in claim 23 wherein the beam splitter is a polarizing beam splitter, the device further comprising a $\lambda/2$ half wave plate and $\lambda/4$ quarter wave plate, the polarizing beam splitter positioned between the $\lambda/2$ half wave plate and the $\lambda/4$ quarter wave plate.

25. The device described in claim 21 further comprising an illumination source configured to illuminate the active region.

26. The device described in claim 25 wherein the laser is the illumination source.

27. The device described in claim 25 wherein the illumination source illuminates the active region through an infrared filter, a collimating lens, another beam splitter, a dichroic beam splitter and the objective lens.

28. The device described in claim 27 further comprising an infrared camera configured to monitor the active region through the objective lens, the dichroic beam splitter, the other beam splitter and a first focusing lens.

29. The device described in claim 21 wherein the detector comprises an aperture configured to guide the reflected laser beam onto a second focusing lens, the second focusing lens configured to focus the reflected laser beam onto a photo diode, the photo diode coupled to detector electronics to detect the reflected laser beam.

\* \* \* \* \*